(12) United States Patent
Jander et al.

(10) Patent No.: US 7,054,114 B2
(45) Date of Patent: May 30, 2006

(54) TWO-AXIS MAGNETIC FIELD SENSOR

(75) Inventors: Albrecht Jander, Corvallis, OR (US); Catherine A. Nordman, St. Paul, MN (US); Zhenghong Qian, Eden Prairie, MN (US); Carl H. Smith, Chatham, NJ (US)

(73) Assignee: NVE Corporation, Eden Prairie, MN (US)

( * ) Notice: Subject to any disclaimer, the term of this patent is extended or adjusted under 35 U.S.C. 154(b) by 330 days.

(21) Appl. No.: 10/715,144

(22) Filed: Nov. 17, 2003

(65) Prior Publication Data

US 2004/0137275 A1 Jul. 15, 2004

Related U.S. Application Data

(60) Provisional application No. 60/426,703, filed on Nov. 15, 2002.

(51) Int. Cl.
*G11B 5/127* (2006.01)
(52) U.S. Cl. .................................... 360/324.1
(58) Field of Classification Search ............. 360/324.1, 360/324.11, 324.12, 325; 324/252; 428/811.5, 428/692, 693
See application file for complete search history.

(56) References Cited

U.S. PATENT DOCUMENTS 6,317,300 B1 * 11/2001 Sasaki et al. ............... 360/325
6,662,432 B1 * 12/2003 Balamane et al. ........ 29/603.07
2004/0080872 A1 * 4/2004 Sato et al. .................. 360/316
2004/0233588 A1 * 11/2004 Ooshashi et al. ...... 360/324.12

OTHER PUBLICATIONS

P.M. Drljača, P. Kejik, F. Vincent, D. Piguet, F. Gueissaz, and R.S. Popović. Single core fully integrated CMOS microfluxgate magnetometer. *Elsevier B.V., Sensors and Actuators*, A 110 (2004) 236-241.

P.D. Dimitropoulos and J.N. Avaritsiotis. Integrating the Fluxgate principle in the Spin-Valve and AMR sensor technologies. *Elsevier B.V., Sensors and Actuators*, A 106 (2003) 43-47.

(Continued)

*Primary Examiner*—Allen Cao
(74) *Attorney, Agent, or Firm*—Kinney & Lange, P.A.

(57) ABSTRACT

A ferromagnetic thin-film based magnetic field sensor with first and second sensitive direction sensing structures each having a nonmagnetic intermediate layer with two major surfaces on opposite sides thereof having a magnetization reference layer on one and an anisotropic ferromagnetic material sensing layer on the other having a length in a selected length direction and a smaller width perpendicular thereto and parallel to the relatively fixed magnetization direction. The relatively fixed magnetization direction of said magnetization reference layer in each is oriented in substantially parallel to the substrate but substantially perpendicular to that of the other. An annealing process is used to form the desired magnetization directions.

15 Claims, 12 Drawing Sheets

OTHER PUBLICATIONS

P.D. Dimitropoulos, J.N. Avaritsiotis and E. Hristoforou. A novel micro-Fluxgate sensor based on the AMR effect of ferromagnetic film-resistors. *Elsevier B.V., Sensors and Actuators*, A 107 (2003) 238-247.

A. Garcia and C. Morón. Biaxial Magnetometer Sensor. *IEEE Transactions on Magnetics*, vol. 38 No. 5, Sep. 2002, 3312-3314.

A. Harmansa, M. Döscher, and M. Weser. New angle-sensor concepts based on KMZ43T and KMA200. *Symposium "Magnetoresistive Sensors VI: Grundlagen• Herstellung • Anwendung"*, Mar. 14, 2001, 8 pages.

P. Brauer, T. Risbo, J.M.G. Merayo, and O.V. Neilsen. Fluxgate sensor for the vector magnetometer onboard the 'Astrid-2' satellite. *Elsevier Science S.A., Sensors and Actuators*, 81 (2000) 184-188.

C. Schott., J.-M. Waser and R.S. Popovic. Single-chip 3-D silicon Hall sensor. *Elsevier Science S.A., Sensors and Actuators*, 82 (2000) 167-173.

R.S. Popovic. Not-plate-like Hall magnetic sensors and their applications. *Elsevier Science S.A., Sensors and Actuators*, 85 (2000) 9-17.

W.S. Wu. Using Integral Coil to Drive a Two-Axis Gyroscope. *IEEE Transactions on Aerospace and Electronic Systems*, vol. 33 No. 1, Jan. 1997, 322-328.

J.L. Prieto, C. Aroca, E. Lopez, M.C. Sanchez and P. Sanchez. New type of two-axis magnetometer. *Electronics Letters*, vol. 31 No. 13, Jun. 22, 1995, 1072.

D. Flynn. A Vector Magnetometer using a Single Permalloy Sensor with Dual Magnetic Feedback. *IEEE Transactions on Magnetics*, vol. 30 No. 6, Nov. 1994, 5038-5041.

* cited by examiner

TWO-AXIS MAGNETIC FIELD SENSOR

CROSS-REFERENCE TO RELATED APPLICATION

This application claims the benefit of Provisional Application No. 60/426,703 filed on Nov. 15, 2002 for "TWO AXIS MAGNETIC FIELD SENSOR".

This invention was made with Government support under Contract NAS1-01011 awarded by NASA. The Government has certain rights in this invention.

BACKGROUND OF THE INVENTION

The present invention relates to ferromagnetic thin-film structures and, more particularly, to ferromagnetic thin-film structures exhibiting relatively large magnetoresistive characteristics.

Many kinds of electronic systems make use of magnetic material based devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

In the recent past, reducing the thicknesses of the ferromagnetic thin-films and the intermediate layers in extended "sandwich" structures in which the two major surfaces of the intermediate layer each have thereon an anisotropic ferromagnetic thin-film layer, including those having additional alternating ones of such films and layers, i.e. superlattices, have been shown to lead to a "giant magnetoresistive effect" being present. This effect yields a magnetoresistive response which can be in the range of an order of magnitude or more greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion. Such an easy axis comes about because of an anisotropy in the film typically resulting from depositing that film in the presence of a fabrication external magnetic field oriented in the plane of the film along the direction desired for the easy axis in the resulting film. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin-film to serve as part of a memory cell and to serve as part of a magnetic field sensor.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the also present anisotropic magnetoresistive effect in very thin-films is considerably reduced from the bulk values therefor in thicker films due to surface scattering, whereas very thin-films are a fundamental requirement to obtain a significant giant magnetoresistive effect.

In addition, as indicated, the giant magnetoresistive effect can be increased by adding further alternate intermediate and ferromagnetic thin-film layers to extend the "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

These magnetizations results often come about because of magnetic exchange coupling between the ferromagnetic thin-films separated by the intermediate layers, these intermediate layers typically formed from a nonferromagnetic transition metal as an electrical conductor. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one another) and antiferromagnetic coupling (such that the magnetizations of the separated layers are opposed to one another, or antiparallel to one another). Thus, for some separation thicknesses, the layer coupling can be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but-to a sufficiently small degree so that the coupling field can be overcome by an external magnetic field.

Another arrangement is to form the ferromagnetic thin-film layers with alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A magnetic field sensor suited for fabrication with dimensions of a few microns or less to tens of microns or more can be fabricated that provides a suitable response to the presence of very small external magnetic fields and low power dissipation by substituting an electrical insulator for a conductor in the nonmagnetic intermediate layer. This sensor can be fabricated using ferromagnetic thin-film materials of similar or different kinds in each of the outer magnetic films provided in a "sandwich" structure on either side of an intermediate nonmagnetic layer which ferromagnetic films may be composite films, but this insulating intermediate nonmagnetic layer permits electrical current to effectively pass therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance, or conductance, characterizing this intermediate layer with respect to the "tunneling" current therethrough. The maximum fractional change in effective resistance is a function of the magnetic polarization of the conduction electrons given by $$(\Delta R/R) \approx 2P_1 P_2 / (1 + P_1 P_2)$$

where $P_1$ and $P_2$ are the conduction electron spin polarizations of the two ferromagnetic layers. These polarizations appear dependent on the ratio of spin up to spin down electrons in the 3D shell of the transition elements used in the ferromagnetic thin-films, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting the conduction electrons in the magnetic layers are assumed to have a fraction of spin up electrons like that of the electrons in the 3D shell. The spin polarization is then determined from $P=2f-1$.

In addition, shape anisotropy is often used in such a sensor to provide different coercivities in the two ferromagnetic layers, and by forming one of the ferromagnetic layers to be thicker than the other. Such devices may be provided on a surface of a monolithic integrated circuit to thereby allow providing convenient electrical connections between each such sensor device and the operating circuitry therefor.

A "sandwich" structure for such a sensor, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized sensor structure.

The current-voltage characteristics of such "sandwich" structure sensors will exhibit a relatively linear change in the quantum electrodynamic effect "tunneling" current therethrough from one ferromagnetic layer through the barrier to the other with respect to the voltage provided across the sensor, i.e. across the barrier layer between these ferromagnetic layers, for relatively lower value voltages, but the current magnitude increases more than linearly for higher values of voltage across the sensor. As the voltage across the sensor increases, the fractional change in the "tunneling" current through the sensor, for the ferromagnetic layers having magnetizations changing from parallel to one another to antiparallel, decreases to being only half as great with several hundred millivolts across the sensor as occurs in the situation with a hundred or less millivolts across the sensor so that this fractional change with sensor voltage will range from a few percent to 20% or more. The fractional change in the resistance of the sensor for the ferromagnetic layers having magnetizations changing from parallel to one another to antiparallel increases to about one and one-half the room temperature values when the sensor is cooled to 77° K., but the "tunneling" current through the sensor increases by only about 10% to 20% indicating that the effective resistivity of the sensor is relatively insensitive to temperature (around 500 to 1000 ppm/° C.).

The effective resistivity of such a sensor is set by the amount of "tunneling" current through the cell permitted by the barrier layer therein for the voltage across the sensor. The high sensitivity of the "tunneling" current to the thickness of the barrier layer leads to a wide range of sensor resistivities which have been observed to be from less than 60.0 Ω-μm$^2$ to 10,000 MΩ-μm$^2$. On the other hand, the barrier layer appears to permit relatively little magnetic coupling between the ferromagnetic layers thereacross with the coupling fields typically being only a few Oe.

The barrier material for such sensing devices has typically been aluminum oxide, $Al_2O_3$ and other such oxides, but other dielectric materials have been used. A typical construction therefor has had two long rectangular ferromagnetic thin-film strips with the barrier layer therebetween such that the long axis of the bottom strip, supported directly on an electrically insulating substrate, is at some angle with respect to that of the upper strip supported thereon through the barrier layer. This arrangement leaves the crossover area where these ferromagnetic strips overlap having the shape of a parallelogram defining the portion of the barrier layer through which there is effective current tunneling between the strips.

These devices in the past have been fabricated by depositing upon the insulating substrate a narrow stripe of the bottom ferromagnetic film typically using a separate, removable mask. A layer of dielectric material is then formed over this bottom film, and then a second narrow stripe ferromagnetic film is deposited through a mask such that the long direction axis of the second stripe is, typically, perpendicular to that of the first. The region of tunneling between the two stripes is then typically shaped as square or rectangle where the two stripes overlap. The shape of the interposed dielectric barrier is inconsequential so long as it is sufficiently large to completely separate the two ferromagnetic thin-film metal stripes. The ferromagnetic layers in these structures are typically simple single films of Fe, Co, NiFe or other common ferromagnetic alloys.

Generally, fabricating a very small overlap area in such sensors using masking techniques is difficult to accomplish because of deposition material spatial distribution variances which can lead to electrical short circuits between the strips. As a result, overlap area, or tunnel junction, dimensions are often of many millimeters in length and relatively thick barrier layers are needed.

The operating current for such sensors is typically supplied through a pair of current leads with one such lead connected to an end of the upper strip and the other lead connected to an end of the lower strip. The effective electrical resistance of the sensor is determined from measuring the voltage across the tunnel junction at two voltage leads each connected to one of the remaining two ends of these strips. Then, by providing a current of a known fixed value through the current leads and measuring the corresponding tunnel junction voltage on the voltage leads, the effective resistance can be simply calculated by dividing the measured voltage value by the chosen fixed current value.

Because, as indicated above, the conduction of current across the barrier of such a sensor is due to a quantum electrodynamic tunneling effect, the conduction turns out to be highly dependent on the thickness of the barrier. An increase of 2 Å in the barrier thickness can lead to an increase the junction resistance by a factor of 10. The measured resistances of tunnel junctions fabricated from the same starting material are inversely proportional to the areas of those junctions. Typical tunneling resistance-area products ($R_A$, calculated by multiplying the resistance by the tunnel junction area) range from $10^{-2}$ to $10^3$ MΩ-μm$^2$. These resistivities correspond to $Al_2O_3$ thickness of about 12 to 30 Å, respectively. Due to the sharp dependence of tunnel resistivity on the barrier thickness, PT can easily vary across a single wafer by a factor of two.

As indicated above, the measured resistance of the tunnel junction in such a sensor is a function of the relative orientation of the magnetizations of the two ferromagnetic thin-film metal strips. The portion of the tunnel junction resistance that is subject to change as a result of that junction experiencing changes in external magnetic fields to which it is exposed is termed junction magnetoresistance (often written JMR, and defined as $\Delta R/R_{min}$ but is equivalently $\Delta V/V_{min}$ for voltage measurements with a fixed current with either being expressed as a percentage). The sensors described above demonstrated that the JMR therefor can be quite large at room temperature (≈70%).

However, such sensors cannot be conveniently incorporated into integrated circuits because the sputter-mask mode of fabrication is not compatible with modern semiconductor fabrication. In addition, the magnetic response of these sensors are not optimized for applications. In particular, they exhibit considerable output response characteristic hysteresis, nonlinearity and other nonideal aspects in their JMR response, including relatively small output signal values and low areal density, as have the tunnel junction field sensor structures of subsequent designs.

A better magnetic field sensor can be made using modem semiconductor fabrication techniques having a junction structure in a sensor cell based on a nonmagnetic intermediate separating material with two major surfaces on one of which is a base anisotropic ferromagnetic thin-film which is also on a base electrode, and on the other of which there is at least one of a plurality of separate anisotropic ferromagnetic thin-films but of differing effective coercivities. The nonmagnetic intermediate separating material can be either a conductive material leading to a GMR device or an insulator leading to a spin dependent tunneling device. Similar structures have a separate film in each that can be interconnected to one another with the interconnections extending at least in part substantially parallel to the widths of the separated films. The base electrode and the separated films can have lengths with gradually narrowing widths toward each end which narrow to zero at the ends. The intermediate material supported on a base electrode can be common to all the separated films thereon. One or more planar conductive coils can be supported at least in part on the separated films.

Often more than one such magnetic field sensor is used in a sensing configuration to provide a larger output signal and, in many instances, to provide some sensor noise cancellation. These goals are many times pursued through use of a bridge circuit in which such giant magnetoresistive effect structures or spin dependent tunneling structures are provided as circuit resistors connected in two parallel branches between two power supply nodes with each such branch having two such resistors in series with one another. A single polarity voltage source is typically connected between the two power supply nodes with in many instances the negative side of the source being grounded. A signal sensing differential amplifier with a pair of inputs is typically electrically connected between the two bridge circuit output nodes, i.e. the internal nodes of each of the two branches which for each is the node between the two resistors connected in series therein.

To have such a bridge circuit operate properly, adjacent ones of the magnetoresistors in the circuit must vary in resistance differently under an applied magnetic field if a signal output is to result. If they each have the same resistance variation, there will be a zero value signal developed between the bridge circuit output nodes, i.e. between the sensing amplifier inputs. Since an externally applied magnetic field to be sensed will be approximately the same for each of the closely spaced resistors in the bridge circuit, design measures are necessary to assure the needed resistive differences nevertheless occur between the adjacent circuit structures or resistors. One such measure previously used has been to place two of these magnetoresistors on opposite sides of the bridge circuit each connected to different power supply terminals under a magnetic shield leaving only the other two such resistors exposed to the effects of externally applied magnetic fields. Such an arrangement, however, allows determining the magnitude of an externally applied magnetic field in only one direction. Another such sensor must be provided to sense another field component. Thus, there is a desire to obtain the needed different magnetic field components sensing by adjacent circuit structures or magnetoresistors on a common substrate.

BRIEF SUMMARY OF THE INVENTION

The present invention provides a ferromagnetic thin-film based magnetic field sensor with a plurality of sensing structures, including first and second sensitive direction sensing structures, supported on a substrate each having a nonmagnetic intermediate layer with two major surfaces on opposite sides thereof upon one of which a magnetization reference layer is provided and upon the other of which is provided an anisotropic ferromagnetic material sensing layer having a length in a selected length direction and a width substantially perpendicular thereto but substantially parallel to the relatively fixed magnetization direction. The relatively fixed magnetization direction of said magnetization reference layer in each is oriented in substantially parallel to the substrate but substantially perpendicular to that of the other. An annealing process is used after forming the sensing structures to obtain the desired magnetization directions.

DETAILED DESCRIPTION

Figure 1A:
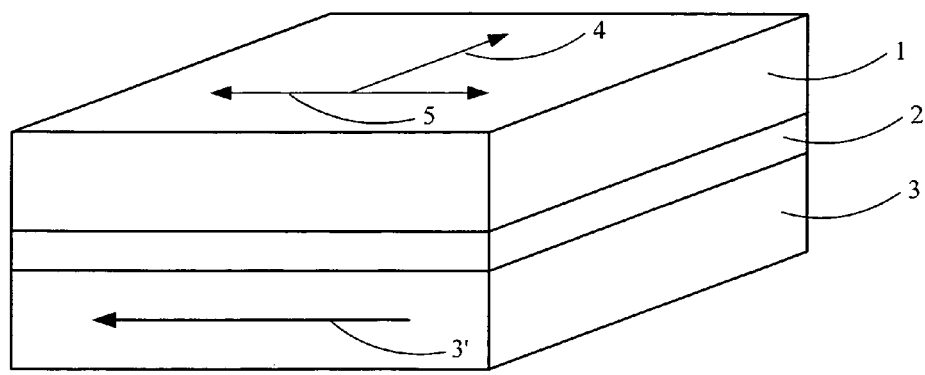
FIG. 1A is a perspective cross section view schematic diagram of a spin-dependent tunneling device showing relative orientations of the magnetization vectors.

The present invention is a magnetic field composite sensor which is fabricated on one substrate and is equally sensitive to magnetic fields in either of two orthogonal directions in the plane of the sensor substrate. The composite sensor uses spin-dependent tunneling magnetoresistive sensing elements or sensors. The two direction equal sensitivity to externally applied magnetic fields results from the selections of sensor geometrical shapes and two separate annealing steps during fabrication, including one undertaken with the aid of flux concentrators or guides of selected shapes and positions, to orient the magnetization pinned axis direction in the sensor reference layers and thereby form the two-axis composite sensor device.

There are currently several types of single magnetic field sensing axis sensors that are fabricated using monolithic integrated circuit fabrication techniques that can be integrated on monolithic integrated circuit chips, and which show high sensitivity to externally applied magnetic fields. These include anisotropic magnetoresistance (AMR) effect sensor devices, giant magnetoresistance (GMR) effect sensor devices, and the device kind used as the sensors here, spin-dependent tunneling (SDT) devices. Two-axis sensing (that allow evaluating the magnitudes and directions of external magnetic field vectors in selected planes) is possible with any two of the foregoing standard single axis sensors positioned in a plane with one having its sensing axis rotated 90° from that of the other. However, for greater spatial resolution of magnetic field values it is advantageous to form densely-packed sensor arrays of high-sensitivity devices. To this end, an ideal sensor would be compact and highly sensitive to allow determination of magnetic field vectors at points with small separation distances from one another.

The use of multiple spin-dependent tunneling sensor devices, or magnetoresistors, fabricated so as to be integrated on a single substrate allows obtaining a composite sensor with both of these attributes. Sensors formed from spin-dependent tunneling devices are ideal in that the intrinsic sensitivity of the structure is greater than that of the other magnetoresistive effect sensor structures. The tunneling magnetoresistance of some available spin-dependent tunneling devices approaches 40 to 50% whereas AMR effect devices may approach only 3 to 5% and GMR effect spin-valve devices may approach 15 to 20%.

As indicated above, spin-dependent tunneling sensor devices or magnetoresistors are typically made of a stack of thin-films including two ferromagnetic material thin-film layers separated by an electrically insulating tunnel barrier film all positioned on an electrically insulative substrate surface typically provided as a monolithic integrated circuit chip or undivided wafer from which such chips are obtained. The magnetization direction of each magnetic material layer is substantially in the plane of the layer and so parallel to the substrate major surface. As shown in the sensor layers schematic diagram of FIG. 1A, the magnetization of an upper one of the layers, 1, (although it could alternatively be the lower one) is allowed to rotate freely with externally applied magnetic fields to be sensed, and so is termed a "free" layer. This is separated by a tunnel barrier film, 2, from a second magnetic material layer, 3, that is shown being lower positioned in the figure (although it could be alternatively the upper positioned layer) that has its magnetization direction, 3', fixed with respect to this stack, or "pinned", and does not rotate with externally applied magnetic fields of expected magnitudes to thus be termed a reference or "pinned" layer. The electrodes (not shown) for the device are provided on or across from the major surfaces of ferromagnetic material layers 1 and 3 that are exposed in this stack so that current through the device passes from one magnetic layer to the other through tunnel barrier film 2 separating layers 1 and 3. The resistance of the junction device is a function of the relative angles between the magnetization vectors in layers 1 and 3 which in turn depend on the magnitude of externally applied magnetic fields.

Spin-dependent tunneling sensor devices with low output response characteristic hysteresis can be made by applying an external biasing magnetic field which rotates the magnetization direction of "free" layer 1 to a position, 4, which is 90° from its induced easy axis, 5. If the biasing field magnitude is not much greater than the magnetic anisotropy of the free layer magnetic material, then the magnetization of free layer 1 is indeed free to rotate in an externally applied magnetic field, or field component, that is applied in the direction along original easy axis 5 of free layer 1. As shown in FIG. 1B, for a fixed current through the barrier layer, the voltage output of such a biased spin-dependent tunneling magnetoresistor is highly field dependent and has little hysteresis, and is therefore suitable for use as a sensor. The difficulty in fabricating a two-axis sensitive composite sensor on a single substrate comes about because of magnetization characteristics requirements for the pinned and free layers in the sensors therein that are sensitive in different, orthogonal axes. That is, the magnetization direction of the free layers in X-direction sensitive magnetic field sensors and Y-direction sensitive magnetic field sensors, absent an externally applied field, must be perpendicular to the direction of magnetization of the pinned layers in each such sensor while also being perpendicular to the free layer magnetization direction of the sensors sensitive in the orthogonal direction. Furthermore, X-axis sensitive sensors must have the pinned layer therein with its magnetization oriented in one direction or another along the X-axis, and Y-axis sensitive sensors, on the other hand, must have the pinned layer magnetization direction therein be parallel to the Y-axis.

The present invention combines techniques of cross-axis annealing and shape anisotropy based biasing, as well as magnetic flux shunting and flux concentrating, to create a high-resolution, low hysteresis output response characteristic, magnetic field composite sensor, 10, that is sensitive in two orthogonal axial directions parallel to the device substrate major surface. All the ferromagnetic thin-films are deposited in single sheet form in the presence of one magnetic field oriented in one direction only during such deposition. Coupled with suitable annealing, each sensing axis of the finally resulting composite sensor has similar sensitivity and response to externally applied magnetic fields which are sensed in the plane of the free layers parallel to the major surface of the substrate. The individual sensors in the composite sensor do not need an externally supplied magnetic field or an orthogonal-field-producing coil to magnetically bias the sensor, but instead use shape anisotropy based effects and cross-axis annealing to eliminate or reduce hysteresis in the output response characteristic and instability in the output.

Figure 2A:
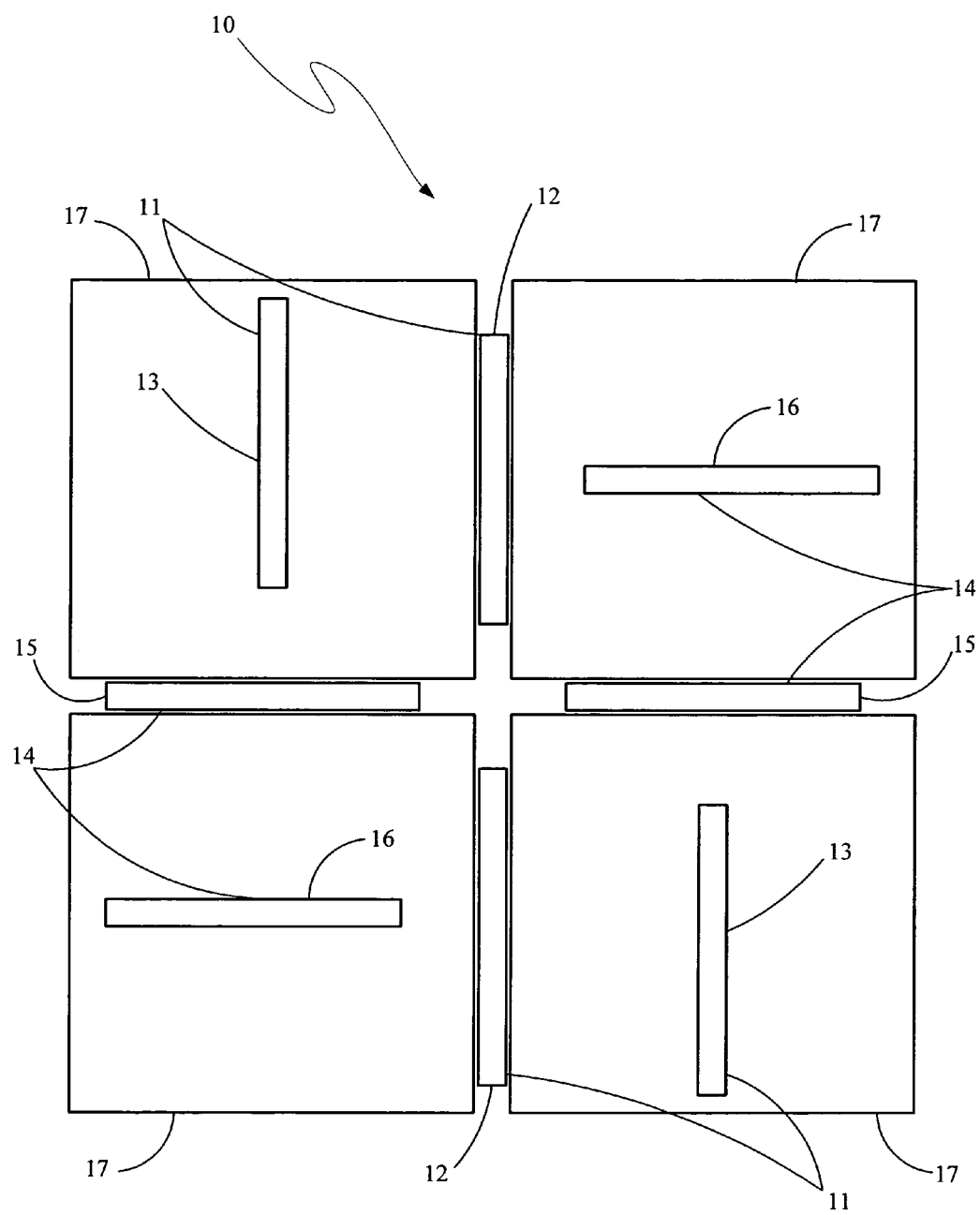
FIG. 2A is a top view schematic of the present invention showing locations of shields and sensor elements.
Figure 2B:
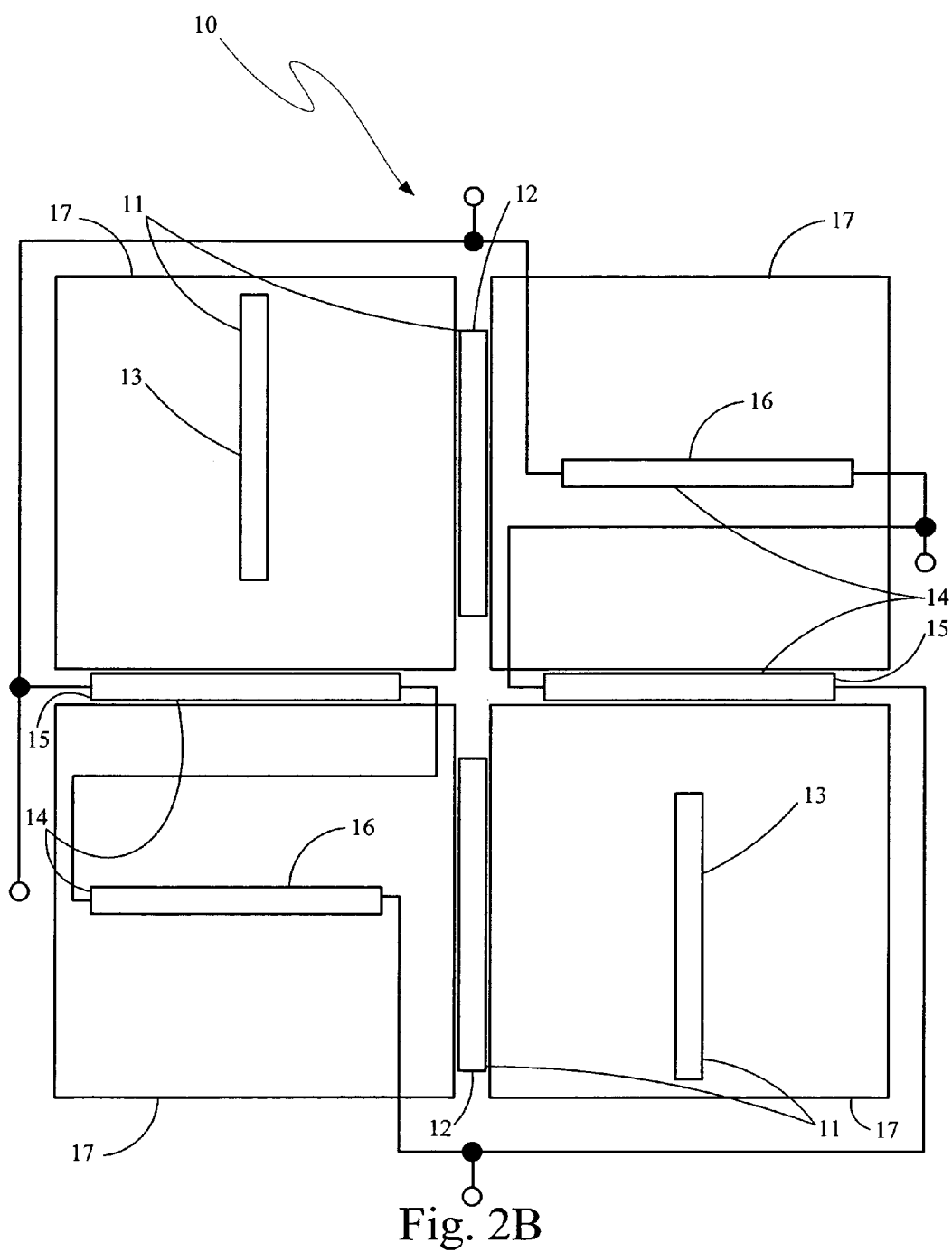
FIG. 2B is a top view schematic of the present invention showing interconnections used for a Wheatstone bridge.
Figure 2C:
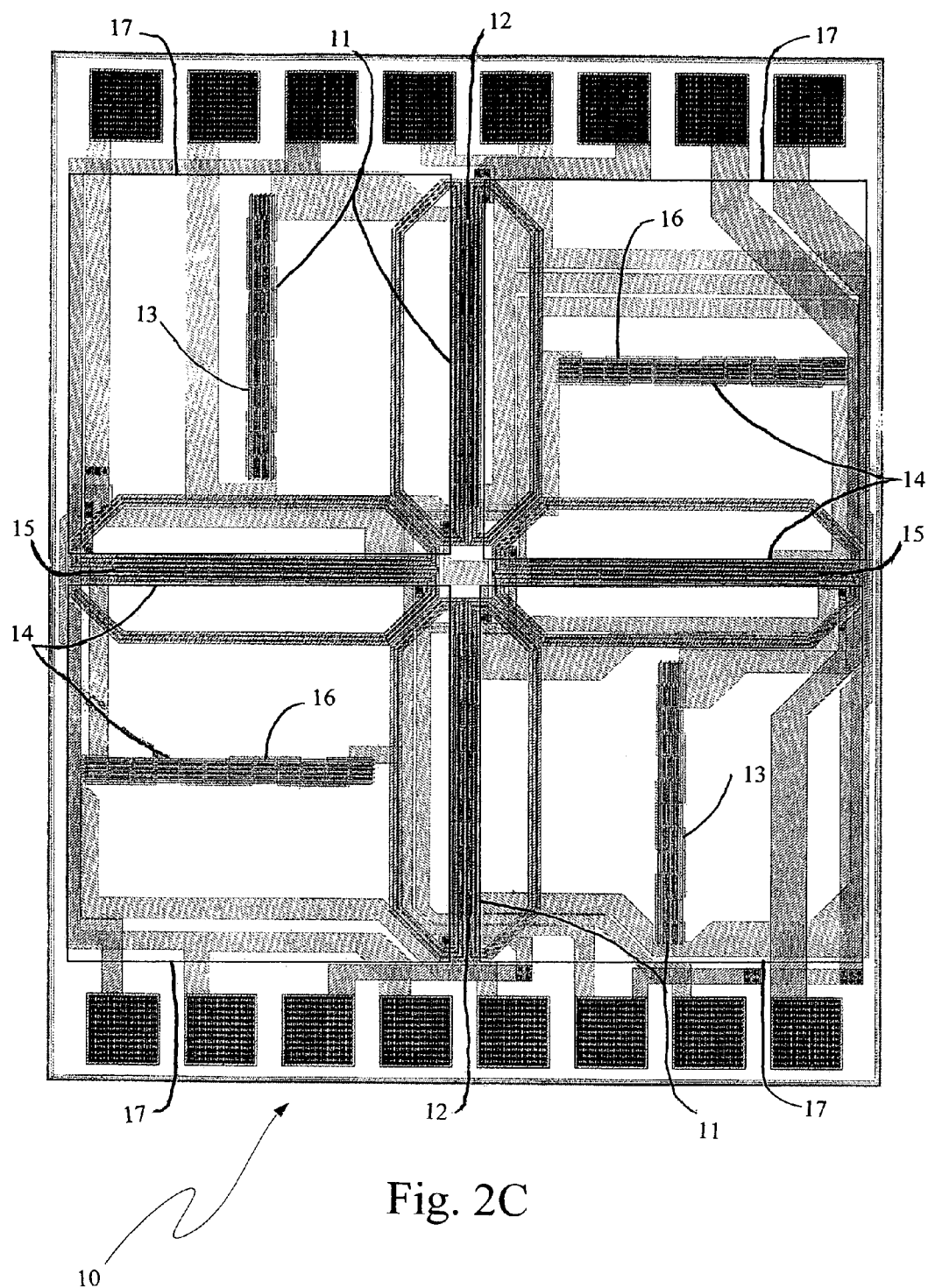
FIG. 2C is a top view of the present invention showing a layout thereof with the orientation and placement of sensors and flux concentrators.

Composite sensor 10 can be configured as two independent but overlapping Wheatstone bridge circuits in which series connected magnetoresistors as sensors are appropriately interconnected as can be seen in FIGS. 2A, 2B and 2C with the positions of unconnected sensors, and of magnetic field shields, only being shown in the layout schematic diagram of FIG. 2A. These magnetic field shields divert through them the magnetic flux otherwise around them in the presence of an externally applied magnetic field in the nearby regions along directions perpendicular to the field direction so that these regions adjacent to such shields have little magnetic flux in them, i.e. are shielded. The nearby regions along the applied field direction, on the other hand, have increased flux values therein and so are regions of flux concentration. Such Wheatstone bridge circuit configurations offer the advantages of temperature compensation and common mode signal rejection.

One bridge circuit, 11, of four sensors has two active sensors, 12, and two shielded, and so inactive or reference, sensors, 13, used together for sensing the X-direction (left to right in FIG. 2A) component of an externally applied magnetic field, and the other bridge circuit, 14, of four sensors has two active sensors, 15, and two shielded, and so inactive or reference, sensors, 16, used together for sensing the orthogonal Y-direction (down to up) component of that externally applied magnetic field. Each sensor, or "leg", of each Wheatstone bridge is formed by interconnecting in series a number of spin-dependent tunneling sensor devices, or magnetoresistors, to form a cumulative length sensor. The four reference sensors 13 and 16 (two for each bridge circuit) are identical in structure to the four active sensors 12 and 15 but are located under a corresponding one of four magnetic field shields (also referred to as a flux concentrator), 17, whereas the active sensors are positioned in the gaps between shields (or concentrators) 10. As indicated in the layout and interconnection schematic diagram of FIG. 2B, which shows interconnections for just Y-axis sensor bridge circuit 14, the bridge circuit legs are connected by metal interconnections in a standard Wheatstone bridge circuit configuration with both power supply terminals and output signal terminals for the bridge circuit also being shown. X-axis bridge circuit 11 has an arrangement that is similar but not shown.

Magnetic field shields (concentrators) 17 are arranged symmetrically in the four quadrants defined by the X- and Y-axes, and serve as both magnetic field shields for the reference sensors, and as flux concentrators for the active sensors. FIG. 2C is taken from a reticle layout for composite sensor 10, and shows the relative positions of all 8 legs of two bridge circuits 11 and 14 with regard to the gaps between magnetic field shields 17. X-axis bridge circuit 11 legs, or cumulative length sensors, are located in the top and bottom gaps between shields 17 so as to have the cumulative lengths thereof follow those gaps, and with the widths of these gaps, as the external magnetic field sensitive X-axis, being between each of the left hand two shields and the corresponding one of the right hand two shields. Y-axis bridge circuit 14 legs, or cumulative length sensors, are located in the left and right gaps of shields 17 so as to have the cumulative lengths thereof follow those gaps, and with the widths of these gaps, as the external magnetic field sensitive Y-axis, being between each of the upper two shields and the corresponding one of the lower two shields. The reference sensors can be arranged anywhere under the shields, but should be parallel to, and across from, the corresponding active sensor in the same bridge circuit in the closest gap.

In an alternative, electrical conductive path coils with pairs of windings, one coil for each of the axial sensors in each of the bridge circuits, can be added to the design. These coils enable X-axis bridge circuit 11 and Y-axis bridge circuit 14 to each be operated in a feedback loop in which electrical currents can be established so as to provide sufficient magnetic flux opposed in direction to the corresponding X-axis and Y-axis flux components present due to an externally applied magnetic field otherwise present to thereby allow nulling out of the combined total X-axis and Y-axis flux components.

Figure 3:
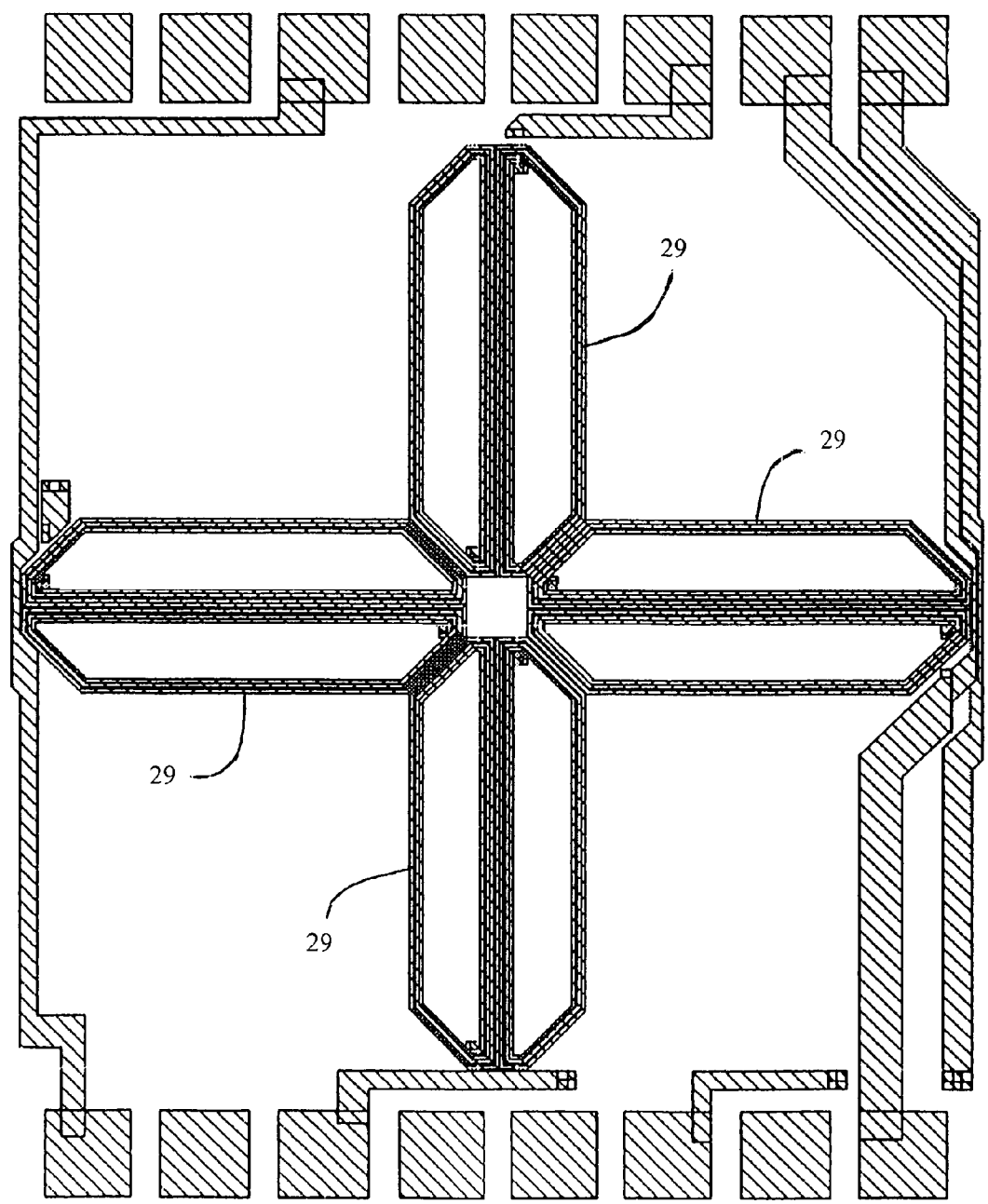
FIG. 3 is a top view of the present invention showing a reticle layout thereof with coils and placement thereof relative to the flux concentrators of FIG. 2C.

Each such coil (the numerical designation shown therefor being set out below), as shown in FIG. 3, has a portion of its windings located in this figure, above and over the corresponding bridge circuit "leg" or cumulative length sensor where positioned in its gap between shields 17 (concentrators). The remaining portions of each coil winding are primarily located symmetrically under the shields 17 (concentrators) on either side of that gap. There are, of course, no corresponding coils provided for the reference sensors.

The magnetic flux generated by a current established in a coil winding through the corresponding active sensor would be produced substantially parallel to the sensing axis of that corresponding active sensor for both the X-axis and the Y-axis external field components sensors. The parallel-field coil could also be used to generate a pulsed applied magnetic field which repeatedly magnetically saturates the free layers of the corresponding sensor and then returns the magnetoresistors to their active states. This magnetic "chopping" of the output signals method can be used to control any remaining hysteresis in the sensor.

Figure 1B:
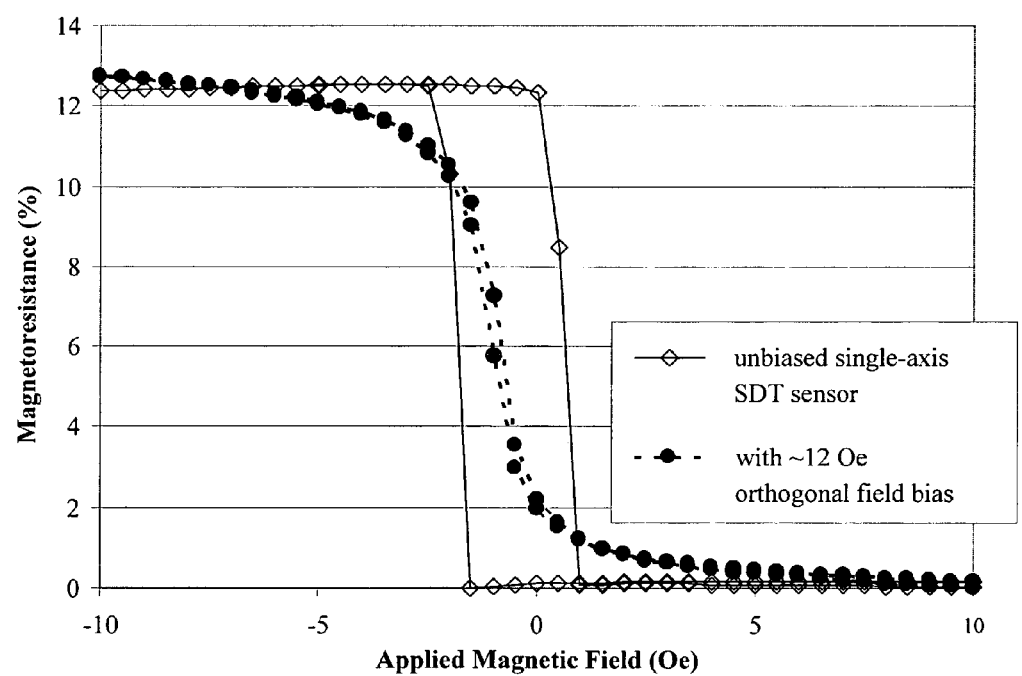
FIG. 1B is a graph showing plots of output voltage from a device like that shown in FIG. 1A with and without perpendicular magnetic biasing.

As indicated above for FIG. 1A, the film stack for forming magnetoresistors joined in series to form cumulative length sensors 12, 13, 15 and 16 comprises soft-magnetic free layer 1, electrically insulating tunnel barrier layer 2, and hard magnetic material, or pinned, layer 3. To aid the pinned axis magnetization direction reorientation for spin-dependent tunneling sensor devices, or magnetoresistors, used to form cumulative length sensors 12, 13, 15 and 16, as further explained below, the pinning structure in reference layer 3 should comprise a low Néel temperature antiferromagnetic film exchange coupled to a ferromagnetic film having moderately low coercivity and low magnetic anisotropy. Free layer 1 should be as magnetically soft as possible to reduce hysteresis and to increase the sensitivity of the device to externally applied magnetic fields.

The provision of two further thin-films in the stack for each magnetoresistor to provide a second ferromagnetic material free layer therein separated from the first free layer, closest to the tunnel barrier layer, by a nonmagnetic material spacer layer is of great advantage for the reduction of any remaining hysteresis in the output response characteristic by properly choosing the thickness of that added layer. That is, adding an augmenting free layer to form such a double free layer is constructed by providing two ferromagnetic films separated by a nonmagnetic spacer layer such as tantalum or ruthenium to thereby form the resulting composite free layer.

One example of such a spin-dependent tunneling sensor device film stack is the sequence, starting at and going outward from the outer surface of the outer electrically insulative layer on the substrate, of 120 Å NiFe/20 Å $Al_2O_3$/50 Å CoFe/350 Å CrMnPt. Variations include composite films in place of the 120 Å NiFe free layer, such as 120 Å NiFe/50 Ta/120 Å NiFe. Other alternatives are composites or variations of the 50 Å CoFe pinned layer, such as using different layer combinations and different stoichiometric compositions of CoFe and NiFe. One such variation is FeCo/FeNiCo/FeCo.

For the device thin-film stack first given above, the ferromagnetic NiFe film serves as free layer 1 of FIG. 1A which is to respond to those externally applied magnetic fields to be sensed. The $Al_2O_3$ is the electron tunneling barrier layer 2 in that figure. The CoFe is a ferromagnetic material film which has its magnetization direction magnetically pinned in a selected orientation parallel to the plane of the outer substrate surface by the antiferromagnetic CrMnPt film. These last two layers forming a structure across the barrier from the free layer serves as the reference magnetic direction layer that is also referred to as pinned layer 3 of FIG. 1A because of exchange coupling between the ferromagnetic material film and the antiferromagnetic material film holding the magnetization direction of the ferromagnetic material film relatively fixed in the presence of externally applied magnetic fields. That is, such coupling prevents the magnetization direction of the CoFe film from changing in the presence of externally applied magnetic fields limited to be of sufficient magnitude to rotate the magnetization direction of the free layer but not that of the reference layer.

However, if the device temperature is elevated above the Néel temperature of the CrMnPt antiferromagnetic material, then the magnetization of the CoFe film can be rotated or flipped in the plane of the film, which is parallel to the substrate outer surface, using a relatively small externally applied magnetic field to do so. When the device temperature subsequently cools below this temperature, the direction of the magnetization of the CoFe film is set where directed by an externally applied field at that time and held there by the coupling to the CrMnPt layer.

Figure 4:
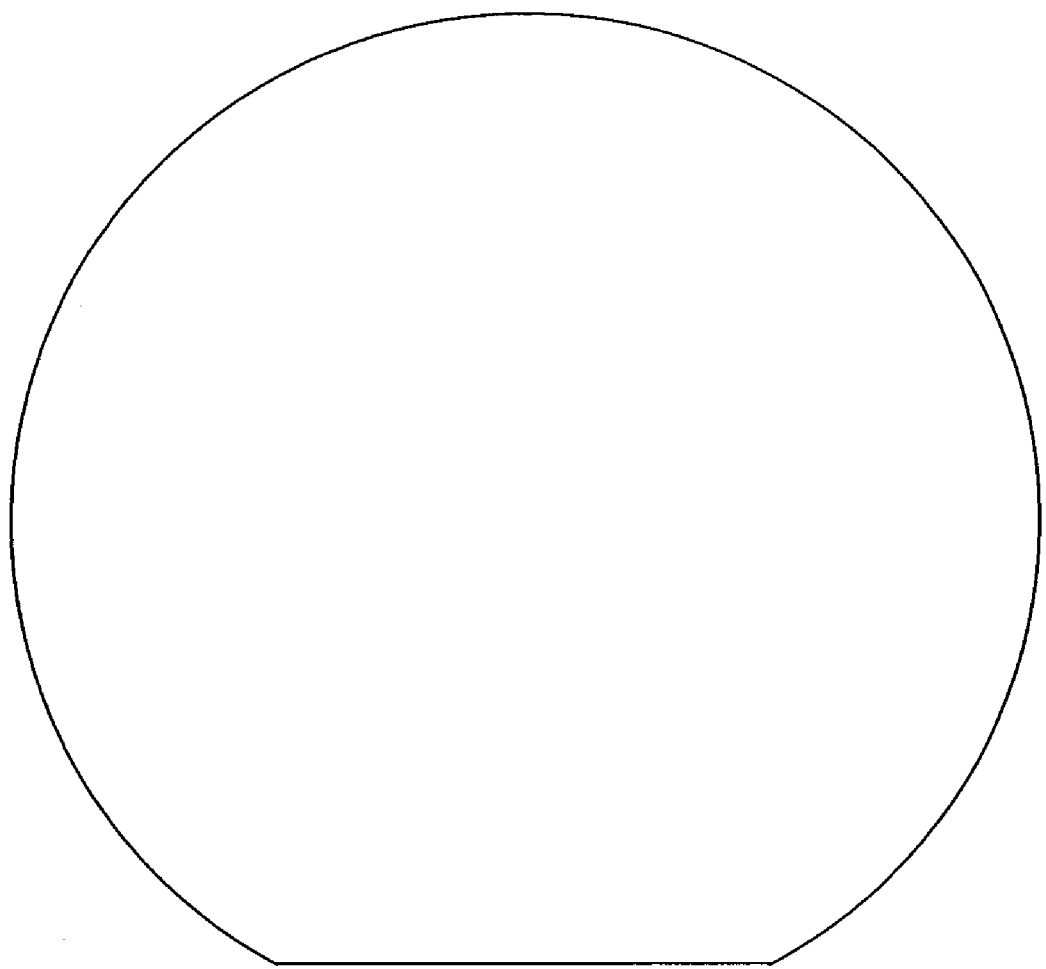
FIG. 4 is a top view schematic showing a monolithic integrated circuit wafer containing the present invention indicating a magnetic field orientation with respect to fabrication thereof.
Figure 4:
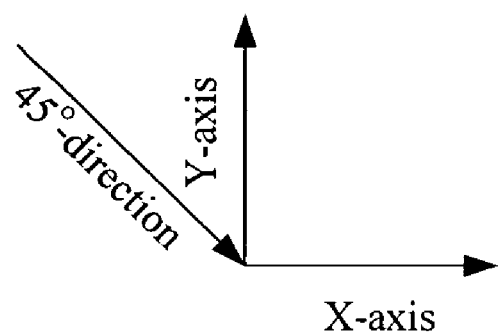

The thin-film stack for the spin-dependent tunneling sensor devices or magnetoresistors used to form cumulative length sensors 12, 13, 15 and 16 is deposited in the presence of an externally applied magnetic field which is oriented in the plane of the substrate wafer (typically a silicon based monolithic integrated circuit wafer) and in a direction which is 45° from length and width directions of the final magnetoresistors present in a sensor subsequently obtained from that wafer. In practice, this typically means 45° from the wafer flat reference (designated as the X-axis direction) as shown in FIG. 4.

Figure 5:
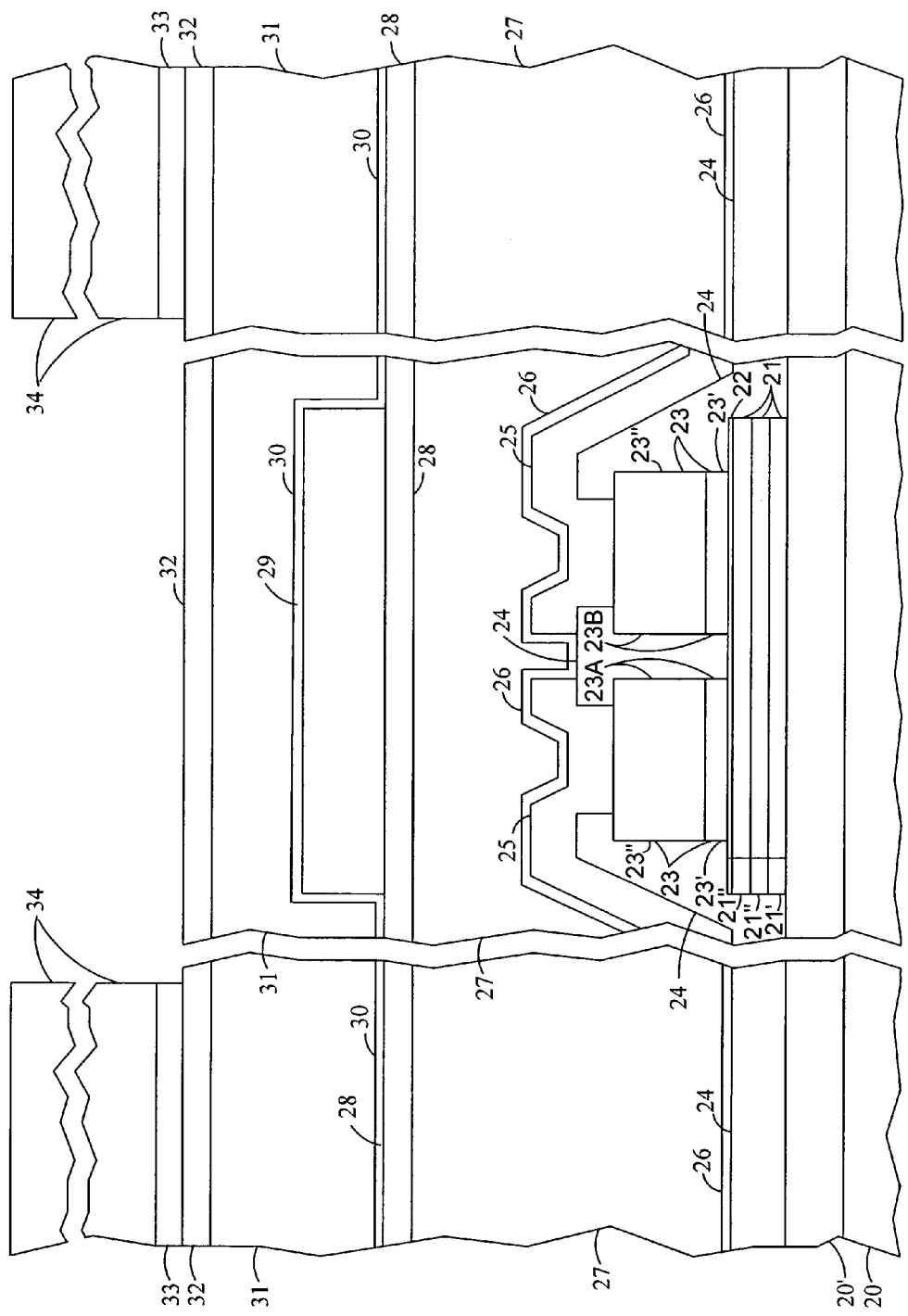
FIG. 5 is a layer diagram of a portion of the present invention.

An example of such a spin-dependent tunneling sensor device or magnetoresistor is shown in the layer diagram of FIG. 5. This figure shows a magnetoresistive side-by-side pinned reference layer, spin dependent tunneling structure each having a pinned ferromagnetic material layer separated from the free layer common to each by an electrically insulative intermediate layer. This layer diagram gives an representational indication of the structural layers, but is not a true cross section view in that simplified layer shapes are shown and many dimensions there are exaggerated or reduced relative to one another for purposes of clarity.

The stack of various kinds of material layers forming this magnetoresistor structure providing such a magnetoresistive spin dependent tunneling magnetic field sensor is fabricated on a monolithic integrated circuit chip substrate, 20, on which is provided a $Si_3N_4$ dielectric base layer, 20', that is 2000 Å thick. The final form of the example magnetoresistive spin dependent tunneling magnetic field sensor device is shown in FIG. 5 as fabricated from the remnants, following etchings, of the following described deposited films or layers which are designated with the same numerical designation used for the portion or portions thereof appearing as part of that final device shown in that figure. Upon this dielectric base layer is deposited a composite free layer, 21, beginning with a 40 Å thick permalloy, or NiFe, layer, 21', to serve after etching as the augmenting, interacting ferromagnetic material free layer in sensing devices. Layer 21' is deposited in the presence of the 45° direction magnetic field with respect the X-axis, as indicated above, having a magnitude of 30 Oe to orient an induced easy axis in the layer in that direction. Next, a 50 Å thick tantalum spacer layer, 21", is deposited on interacting free layer 21'. This is followed by depositing a 40 Å thick permalloy, or NiFe, layer, 21''', on spacer layer 21" in the presence of a 30 Oe field in the same direction. Layer 21''' serves after etching as the sensing ferromagnetic material free layer in composite free layer 21 in the resulting sensing devices. Nonmagnetic spacer layer 21" between the free layers is thick enough to assure 1) that layer surface roughness based magnetostatic coupling, or topological or 'orange peel' coupling, between the two free layers is negligible, and 2) that no electron can pass therethrough without losing its initial spin state, i.e. thick enough to randomize the electron spin states of any layer traversing electrons upon emergence therefrom, so that only the signal response from the free layer closest to the intermediate layer can contribute to the giant magnetoresistive response of the sensor in the presence of externally applied magnetic fields.

Thereafter, an aluminum layer of 15 Å thickness is deposited on the sensing free layer and oxidized to form a 20 Å thick aluminum oxide barrier layer, 22, as a nonmagnetic, electrically insulative intermediate layer for the sensing devices. The layers for reference layer structures, 23, are next deposited, and from these two side-by-side reference layer structures, 23A and 23B, will be provided for the sensing devices on the barrier layer following etching. The first layer therein is a cobalt iron, or CoFe, layer, 23', that is 54 Å thick that is deposited on barrier layer 22. This last deposited layer after etching forms "pinned" layers in the magnetoresistor sensing devices and is again deposited in the presence of a magnetic field with a magnitude of 30 Oe in the same 45° direction. Layer 23' has magnetization directions in its remnants after etching that are "pinned" in the selected orientation after final annealing by corresponding antiferromagnetic layers obtained from depositing on layer 23' an antiferromagnetic material "pinning" layer, 23". This last layer is also deposited in the presence of a magnetic field with a magnitude of 30 Oe in the same 45° direction, the antiferromagnetic material being CrMnPt deposited to a thickness of 350 Å.

Following the provision of these layers to form a stack thereof, an annealing step is undertaken. The substrate and the stack are heated in the presence of a magnetic field with a magnitude of 4000 Oe in the same 45° direction with this field being maintained during one hour of heating at 250° C. in forming gas, and during the subsequent cooling. This is done for purposes of improving the characteristics of barrier layer 22, and for reducing the dispersion of the angular orientations of the easy axes from the initial selected direction over the extents thereof.

In a resulting sensing device, the two free layers 21' and 21" in composite free layer 21 are formed as continuous layers beneath two split apart reference layer structures to thereby form side-by-side spin dependent tunneling structures. These two reference layer structures positioned on a segregated common composite free layer 21 are provided by performing two etchings in fabricating the desired spin-dependent tunneling junction sensor devices, or magnetoresistors, each of which is very narrow in its width direction and relatively quite long in the orthogonal length direction. These widths and lengths of resulting magnetoresistors used to form sensors 12, 13, 15 and 16 are either parallel to, or perpendicular to, the wafer X-axis, i.e. the wafer flat reference. The reason for this geometrical relationship of the magnetoresistor lengths and widths is to achieve magnetic biasing of the free layers in the magnetoresistors by means of shape anisotropy alone, and without any need for externally applied biasing fields as will be further described below.

The first of these etchings is begun by using patterned photoresist to form a reactive ion etching mask for use in patterning a deposited silicon nitride layer that becomes a "hard mask" once the reactive ion etching process removes unwanted regions of this silicon nitride layer that remain uncovered by the patterned photoresist. The resulting "hard mask" is used in an ion milling step that removes all materials uncovered by the "hard mask", and so exposed to the etching, those materials in layer 23" uncovered by the mask, and in each layer below those portions of layer 23", being etched away down to aluminum oxide tunnel barrier layer 22 to thereby form two side-by-side reference layer structures 23A and 23B each supported on barrier layer 22. Reference layer structure 23A comprises pinned layer 23' and pinning layer 23". Similarly, reference layer structure 23B comprises pinned layer 23' and pinning layer 23".

A similarly formed hard mask is thereafter provided and used for a second etching, or ion milling step, to remove all materials uncovered by this second "hard mask", and so exposed to the etching, those portions of layer 22 uncovered by the mask, and the portions of each layer therebelow, again being etched away down to silicon nitride layer 11 to form the common or interconnected free layers below these two reference layers and to separate or segregate the sensor devices from one another. Side-by-side reference layer structures 23A and 23B are formed in a sensing device where the masks for these two etches have coinciding surface covering portions over the stack surface. Those stack surface portions at which only the second mask provided cover are locations where only the interconnected composite free layer structure remains. All other parts of the initial stack have no remaining conductive material therefrom remaining, i.e. have just layer 11 present where they were initially present after deposition prior to etching. Thus, two tunnel junctions are formed below reference layer structures 23A and 23B which are each positioned over the common composite free layer structure on the opposite side of barrier layer 22 therefrom.

A silicon nitride passivation layer, 24, is sputter deposited over the side-by-side tunnel junction structures to a thickness of about 2500 Å. Photolithography is used to form an etching mask for use in reactive ion etching to establish a pattern of openings in layer 24 for interconnections. Aluminum interconnection metal is deposited over the remaining portions of passivation layer 24 and into the contact openings to a thickness of about 5000 Å. This aluminum layer is patterned using a photoresist etching mask and reactive ion etching again to form the metal interconnections network, 25. A final silicon nitride protective interface layer, 26, is provided by sputter deposition to a thickness of 500 Å.

A first annealing of the resulting formed magnetoresistors is then performed in the presence of a magnetic field with a magnitude of 4000 Oe in the same 45° direction with respect to the X-axis. This field maintained during a one hour heating at 250° C. in forming gas and during the subsequent cooling, and serves to reduce the dispersion of the angular orientations of the shape anisotropy induced magnetization direction along the lengths of the magnetic material layers over the extents thereof. However, the primary purpose of this annealing is to orient the directions of magnetization of composite free layers 21 which will be further described below.

In those situations in which electrical current coils for magnetic fields generation are desired to be formed as part of the final monolithic integrated circuit, they are formed next prior to providing the shields (flux concentrators). A 2 µm planarizing polymer layer is coated over the interconnections network 25 and over the exposed portions of silicon nitride layer 26. This planarizing polymer layer is given a hard cure by heating, through either a convection flow or on a hot plate, sufficiently to cause the patterned planarizing polymer layer to reach a temperature in excess of 200° C. A cured planarizing polymer layer, 27, results which serves as a dielectric, or electrical insulating material, between electrical current coils to be subsequently provided and sensors 12, 13, 15 and 16 along with interconnections network 25 provided beneath silicon nitride layer 26.

The polymer material chosen for layer 27 must be chosen with some care. The temperature at which it can be hard cured, or cross-linked, must be low enough to avoid damaging sensors 12, 13, 15 and 16. In addition, the material of layer 27 should provide improved planarization of the resulting surface of this layer over that of the surface on which it is formed, and it should adhere well to that latter surface. B-staged bisbenzocyclobutene (BCB) available from Dow Chemical Company in Midland, Mich. under the trade name CYCLOTENE, available in both photodefinable and nonphotodefinable versions, is used here.

A chemical interaction prevention layer is next needed to be provided on deformable polymer dielectric layer 27 to prevent etchant attack of the polymer in subsequent etchings, as well as adhering coil structures to be next provided to layer 27. Silicon nitride is thus provided here by sputter deposition to a thickness of 3000 Å to form a stiffening layer, 28. Photoresist is then provided over this chemical interaction prevention to be formed into an etching mask. Reactive ion etching is used to remove the exposed portions of nitride layer 28, the portions of polymer layer 27 therebelow, and to also remove those portions of silicon nitride layer 26 therebelow remaining over those portions of metalization interconnection layer 25 at which bonding pads are to be provided for external interconnection thereto so that via openings for such interconnections result.

Directly thereafter, a 1.8 µm layer of unalloyed aluminum is sputter deposited onto the remaining portions of the previously deposited silicon nitride stiffening layer, and onto the exposed portions of interconnection network 25, from which to form the electrical conductor coils and the bonding pads therefor. Photoresist is then provided over this aluminum layer to be formed into an etching mask, and patterned for this purpose so as to leave portions thereof at locations where the input conductor coil and the bonding pads, including those for this coil, are to result. Reactive ion etching, using a mixture of chlorine, boron trichloride and nitrogen, is used to remove the unwanted portions of the aluminum, so as to leave coil, 29, and integrally formed bonding pads which are shown only in a block representational form in FIG. 5. A further silicon nitride protective interface layer, 30, is provided by sputter deposition to a thickness of 500 Å.

A further BCB polymer layer, provided as a planarizing passivation dielectric layer, is then coated to a thickness of 2 µm on silicon nitride protective interface layer 30 provided over electrical conductor coil 29, the bonding pads and bonding pad interconnects in interconnection network 25, and chemical interaction prevention layer 28. This polymer dielectric layer is then hard cured by heating them in a convection flow or on a hot plate sufficiently to reach a temperature exceeding 200° C. to form planar polymer layer, 31. A layer of silicon nitride is provided here by sputter deposition to a thickness of 1500 Å to form a further chemical interaction prevention layer, 32, on polymer layer 31. Photoresist is then provided over this stiffening layer to be formed into an etching mask. Reactive ion etching is used to remove the exposed portions of nitride layer 32 over the bonding pads and over those portions of metalization interconnection layer 25 exposed for operating the circuit below, the portions of polymer layer 31 therebelow, and to also remove those portions of silicon nitride layer 26 therebelow remaining over those portions of metalization interconnection layer 25 exposed for operating the circuit below.

A seed layer for the plating of magnetic shields (flux concentrators) is deposited to a thickness of 1000 Å over those locations and over the exposed portions of stiffening layer 32. This seed layer is formed by sputter depositing a magnetically permeable alloy such as Ni Fe Co in concentrations of 65%, 15%, and 20%, respectively. This seed layer is then coated with a layer of photoresist of around 10 µm thickness which is then exposed and developed to define the regions where the shield (flux concentrator) structures are to be plated as indicated in FIGS. 2A, 2B and 2C. Electroplating is then used to plate an alloy of NiFe as a magnetic shield to a thickness of 14 µm at these locations with the composition being 80% Ni and 20% Fe.

Thereafter, the photoresist which has served as a plating mold is removed in an acetone solvent bath. Finally, portions of the seed layer exposed by the removal of the photoresist plating mold are then removed using an angular etch ion mill to thereby leave seed layer portions, 33, as a base under a pair of magnetic shields (flux concentrators), 34, as shown in FIG. 5.

Figure 6A:
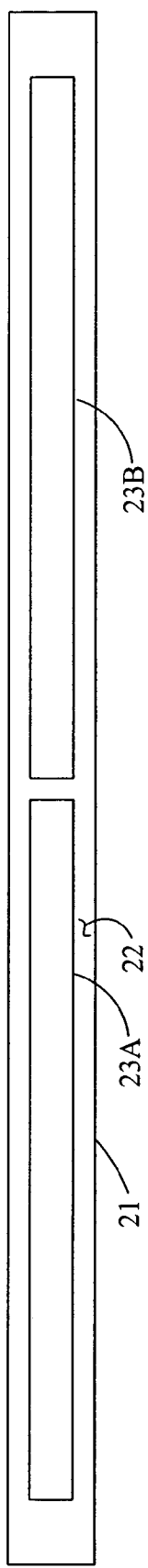
FIG. 6A is a top view schematic showing a shape anisotropy biased sensor.
Figure 6B:
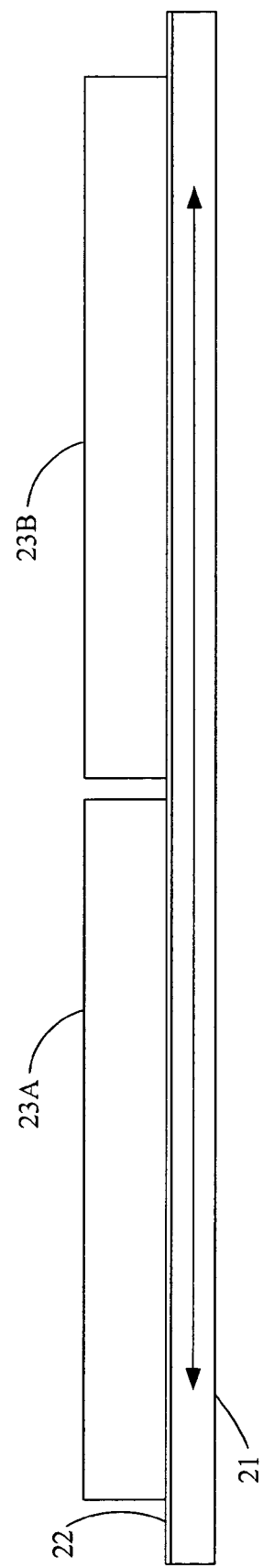
FIG. 6B is a side view schematic showing a shape anisotropy biased sensor.

To achieve shape anisotropy based biasing, the specific magnetoresistor dimensions (including the aspect ratios of length to width) can be variably selected depending on the thickness of the thin-films used in the spin-dependent tunneling junction sensor device stack of such thin-films. Typically, the widths of devices in connection with the thin-film thicknesses indicated above are between 2 and 6 µm, and the lengths are between 80 and 500 µm. Forming magnetoresistor structures that are long and narrow results in the structure edge demagnetizations favoring the orientation of the magnetization direction of the corresponding free layer, or the NiFe film nearest the substrate, to be in the direction of minimum magnetostatic energy or along the length of the magnetoresistor device shown in representational form in FIGS. 6A and 6B segregated from the integrated circuit structure in which it formed as shown in FIG. 5. The "free layer" direction of magnetization is indicated by the double headed arrow superimposed on composite free layer 21 in FIG. 6B. As a result, the demagnetization fields act as shape anisotropy based biasing fields requiring no electrical power to achieve this effect.

Figure 7:
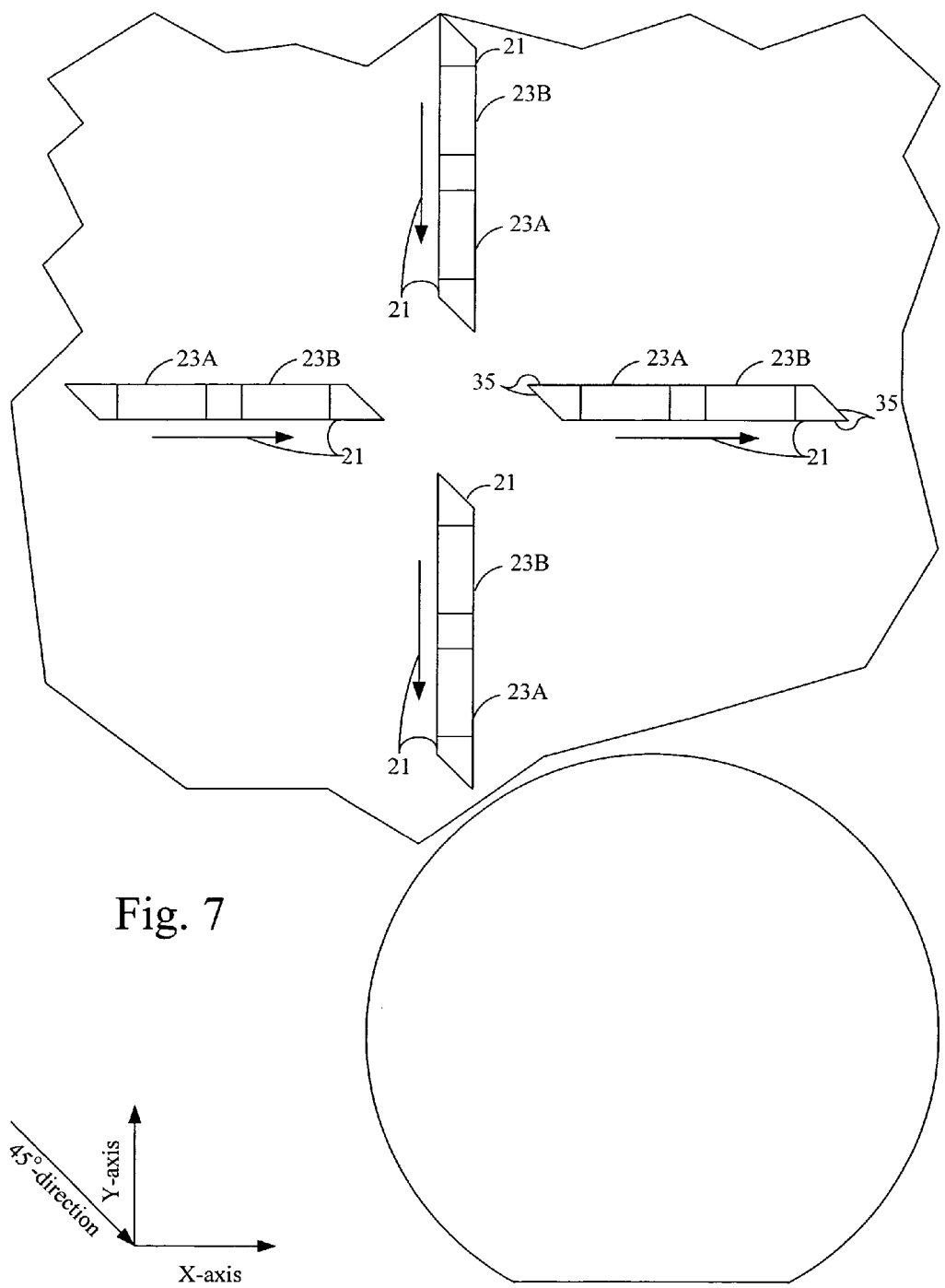
FIG. 7 is a top view schematic of the present invention showing relative orientations of magnetization vectors of free layers in sensors for both X-axis and Y-axis sensors in connection with the schematic of FIGS. 2a and 2B.

This shape anisotropy based biasing effect is useable to orient the magnetization easy axes of composite free layers 21 (or layer 1 in FIG. 1A) in each of the different magnetoresistor sensor structures 12, 13, 15 and 16 provided on the same substrate in corresponding ones of two different orthogonal directions with respect to X-axis, i.e. the wafer flat reference (perpendicular and parallel thereto) even though just one externally applied field in only one direction is used in doing so as described above in connection with the first annealing of the formed magnetoresistors. This reorienting of the easy axis direction in composite free layer 21 of each magnetoresistor on a common substrate to thereby be oriented along the length of that magnetoresistor as shown in FIG. 7 by the arrow magnetization vector representation thereof that is also designated by numeral 21, and so being perpendicular to the easy axis direction of others of those magnetoresistors extending in the orthogonal direction, is achieved using an annealing process.

In that annealing process, an externally applied field is applied in a direction that is at 45° to both of these axes as described above and as indicated in FIG. 7. This annealing is typically done at 250° C. in the presence of the externally applied magnetic field which is chosen to have a magnitude that is well above the saturation field values of composite free layers 21 of the magnetoresistors in sensors 12, 13, 15 and 16. The providing of such an externally applied field during this annealing directed at 45° to both of the magnetoresistor lengths and widths (and in the original direction of the magnetic thin-films easy axes as deposited in being done in the presence of a magnetic field so oriented) is done so that the magnetoresistors in the sensors 12, 13, 15 and 16 that are to provide X-axis field sensing in subsequent use and those that are to provide Y-axis field sensing in subsequent use will all receive equal magnitude components of the externally applied magnetic field along the lengths thereof.

Additional shaping of the ends of composite free layers 21 in the magnetoresistors is provided to aid in keeping those free layers as single magnetic domains or at least closer to being single magnetic domains. Thus, pointed ends, 35, are provided on magnetoresistor composite free layers 21 that taper in the corresponding directions of the components of the externally applied magnetic fields that each such magnetoresistor is intended to sense.

Achieving linearity and low hysteresis in the magnetoresistor output response characteristics then requires that the pinned or reference direction of pinned layers 23' in reference layer structures 23 of the formed magnetoresistors on a common substrate be reoriented to be across, or perpendicular to, the lengths of the magnetoresistors, i.e. along the widths thereof. This is accomplished through the aid of thick layers of highly permeable magnetic material such as NiFe positioned over selected magnetoresistors supported on the substrate that are plated there as shield-concentrators 17 in openings at such locations in a photoresist mask provided as described above. Magnetic shield-concentrators 17 are thereby provided over reference sensors 13 and 16, and also positioned to be along side actively sensing sensors 12 and 15 positioned in the gaps between those shield-concentrators 17. The process described above used to provide four flux shield-concentrators 17, one in each of four quadrants of a chip substrate surface, with narrow gaps in comparison to the extents of the shield-concentrators therealong, yields shield-concentrators that split externally applied magnetic fields in the plane containing these structures into two orthogonal components. Field components oriented across the widths of gaps between shield-concentrators 17 will be enhanced through concentration of the applied field (roughly by a ratio of the length of one concentrator over the width of the gap) through the faces of those shield-concentrators perpendicular to the field component because of the permeability thereof. Concurrently, field components along the lengths of gaps between shield-concentrators 17, that is, along the faces of those shield-concentrators parallel to the field component, will be attenuated as a result of the concentration of the field components across the perpendicular faces. These shield-concentrator 17 concentration results effectively split externally applied magnetic fields into X-axis components and Y-axis components, and the provision of X-axis sensors and Y-axis sensors allow these field components to be sensed separately.

Such effective splitting of externally applied magnetic fields into X-axis components and Y-axis components are demonstrated in two dimensional computer simulations. Shield-concentrators 17 that were simulated were 700 µm on each side, 10 µm thick, and with a gap therebetween of 70 µm. The results showed that for the gap width chosen, no matter what magnetization direction was used for the externally applied magnetic field, the resulting field vector plots showed substantially aligned flux, perpendicular to each edge of the guide, with only small regions near the corners of the concentrator-shields showing field orientations not perpendicular to a side of the concentrator-shield.

Figure 8:
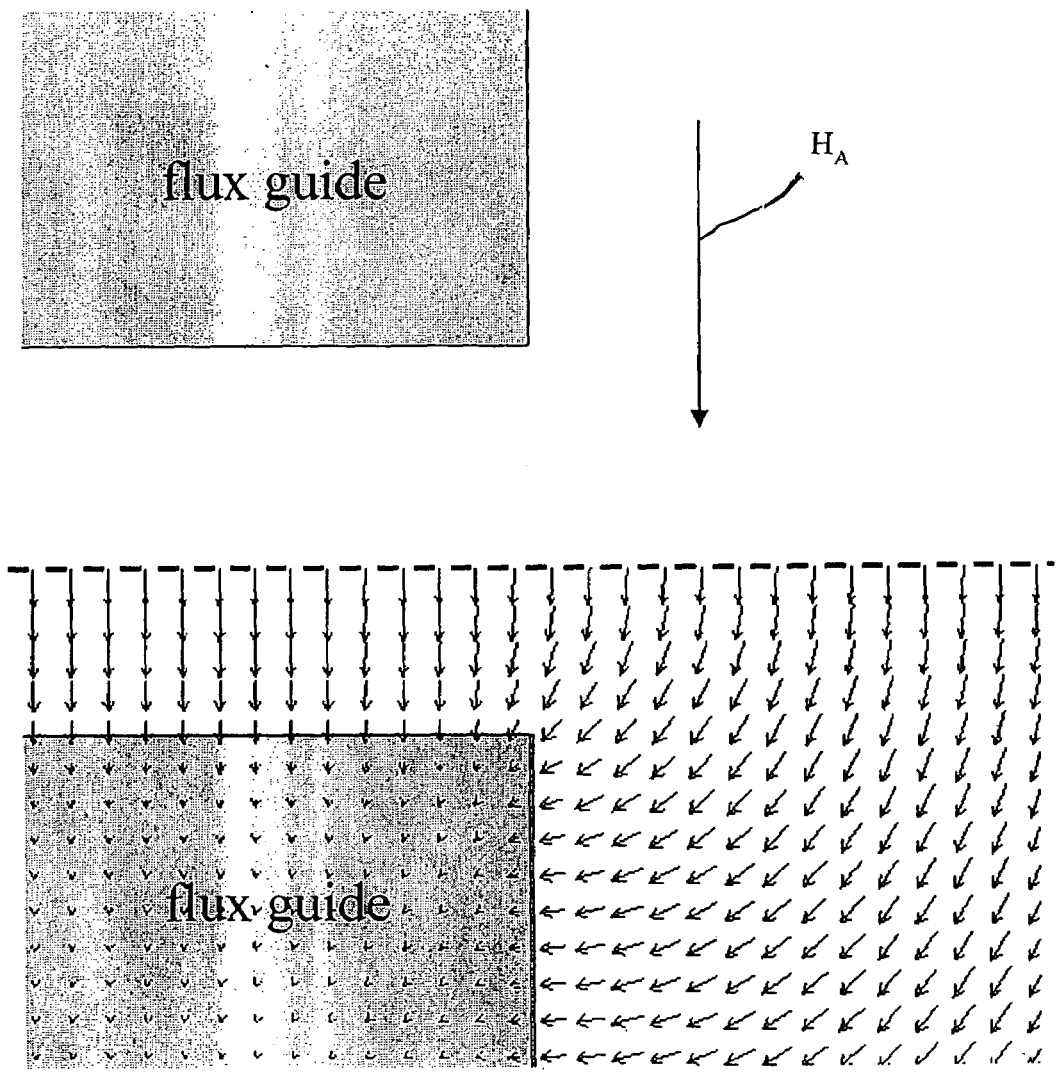
FIG. 8 is a top view schematic showing the magnetic vector field over a portion of a selected structure resulting from an externally applied magnetic field in the presence of a flux concentrator serving as a field guide.

FIG. 8 shows the results obtained for a portion of one such simulation near a corner of a simulated shield-concentrator for an externally applied field, $H_A$, oriented perpendicularly to a side of that simulated shield-concentrator. Thus, the choice of using an externally applied magnetic field oriented at 45° to each of the X-axis and Y-axis directions (not the situation in the example shown in FIG. 8) assures that the applied field component occurring in each gap between shield-concentrators 17 is identical in magnitude despite being oriented perpendicularly to one another across gaps meeting at a corner of a concentrator-shield.

Thus, a second annealing of the formed magnetoresistors is undertaken after completing shield-concentrators 17 to reorient the directions of the magnetizations of pinned layers 23' of the magnetoresistors to be 90° from the directions of the shape anisotropy induced magnetization directions of composite free layers 21, directions that are oriented to lie along their lengths. This annealing is accomplished through a further brief heating of the formed magnetoresistors including the antiferromagnetic film (CrMnPt layers) in pinning layers 23" to a temperature above, or below but near, the Néel temperature thereof (the lower but near temperature being the blocking temperature of such a layer). This is done while applying again an external magnetic field of a magnitude less than the saturation values of shield-concentrators 17 in the very same 45° direction with respect to the X-axis as the one applied during the first annealing described above for reorienting the shape anisotropy induced magnetization directions of composite free layers 21. Shield-flux concentrators 17 provide magnetic field components from the externally applied magnetic field in the two necessary orthogonal field directions along the X- and Y-axes. If the magnetoresistors are heated and cooled relatively quickly there will be a limited effect on the shape anisotropy induced magnetization directions of composite free layers 21. Furthermore, the magnetization vectors of composite free layers 21 return to their magnetic orientations along the lengths of the corresponding ones of the magnetoresistors by virtue of the shape anisotropy based bias and the reduced influence of exchange coupling across the corresponding one of tunnel junction barrier layers 22. Reference layer structures 23, however, will have the magnetization direction of pinned ferromagnetic material layer 23' therein set through exchange coupling in the directions of the orthogonal externally applied magnetic field components by antiferromagnetic material (CrMnPt) pinning layer 23" therein as they cool.

Since the annealing step for reorienting the magnetization direction for pinned ferromagnetic material layers 23' is done at a temperature higher than the blocking temperature for pinning antiferromagnetic material layers 23", and utilizes the magnetic flux guiding effects provided by shield-concentrators 17, there is a limit to the externally applied field that can be used. The limit occurs at roughly the demagnetization field strength for shield-concentrators 17. For externally applied magnetic fields having intensities greater than this value, the shield-concentrators 17 become saturated and, as a result, the magnetic field vectors in the gaps have increasingly greater components in the direction of the applied field (45 degrees to the major axes of the device) rather than being primarily perpendicular to the extent directions of those gaps as desired. To minimize the differences between the resulting magnetic field directions appearing in the gaps during this annealing, provided for reorienting the magnetization directions of pinned layers 23' in reference layer structures 23, and the desired directions therefor (orthogonal to the directions of extents the gaps between shield-concentrators 17), the externally applied field strength should be kept near this demagnetization field value.

A simplified estimate of this maximum externally applied field strength can be made assuming that a 800 μm-long by 14 μm-thick shield-concentrator can be reasonably represented for magnetostatic calculations by a flattened spheroid inscribed therein. The demagnetization field is then given by $$H_d = N_d(4\pi M_{sat}),$$

where $N_d$ is a demagnetization factor, in this case equal to the thickness divided by the sum of the thickness, width, and length of such a shield-concentrator. $M_{sat}$ is the saturation magnetization of the permeable magnetic material composition used. The value of $4\pi M_{sat}$ for the NiFe material used in shield-concentrators 17 is roughly 10,000 Oe. The optimum external field to apply that gives the maximum orthogonally directed field in the flux concentrator gap is then approximately the demagnetization field or, from the foregoing values and equation, roughly 80 Oe.

A composite sensor using these shield-concentrators with gaps of roughly 70 μm widths, the field components along the major axes of the device are then $$Hx = Hy = \cos(45°) * H_{applied} * FC = (\text{approximately}) \ 350 \ \text{Oe}$$

where FC is the flux concentration ratio provided by the shield-concentrators which in situation given here is a ratio approximately equal to 7 and $H_{applied}$ is set to 80 Oe. The effective field strength in the gaps of 350 Oe, combined with an annealing temperature above the blocking temperature of the CrMnPt antiferromagnetic material forming pinning layer 23", is sufficient to allow reorientation of the magnetization easy axis direction of a soft ferromagnetic film made of NiFe, NiFeCo, CoFe, or other suitable material. When the composite sensor device is cooled below the blocking temperature, still in the presence of this externally applied reorientation field, the magnetization direction becomes fixed, or pinned, by antiferromagnetic layer 23" in this new orientation.

A recapitulation of a suitable annealings sequence for the formed magnetoresistors, as describe above, is the following:

1) a first annealing at a relatively high-temperature after the magnetoresistors are formed, but prior to forming the coils and shield-concentrators, in the presence of an externally applied magnetic field at 45° with respect to the X-axis (and so to the lengths and widths of the magnetoresistors) at a temperature of 250° C. for an hour in with this field having a magnitude of 4000 Oe, and 2) a second annealing at a slightly higher temperature after the magnetoresistors are formed and after the coils and shield-concentrators are formed, in the presence of an externally applied magnetic field at 45° with respect to the X-axis (and so to the lengths and widths of the magnetoresistors) at a temperature of 265° C. for an hour in with this field having a magnitude of 70 Oe.

Figure 9:
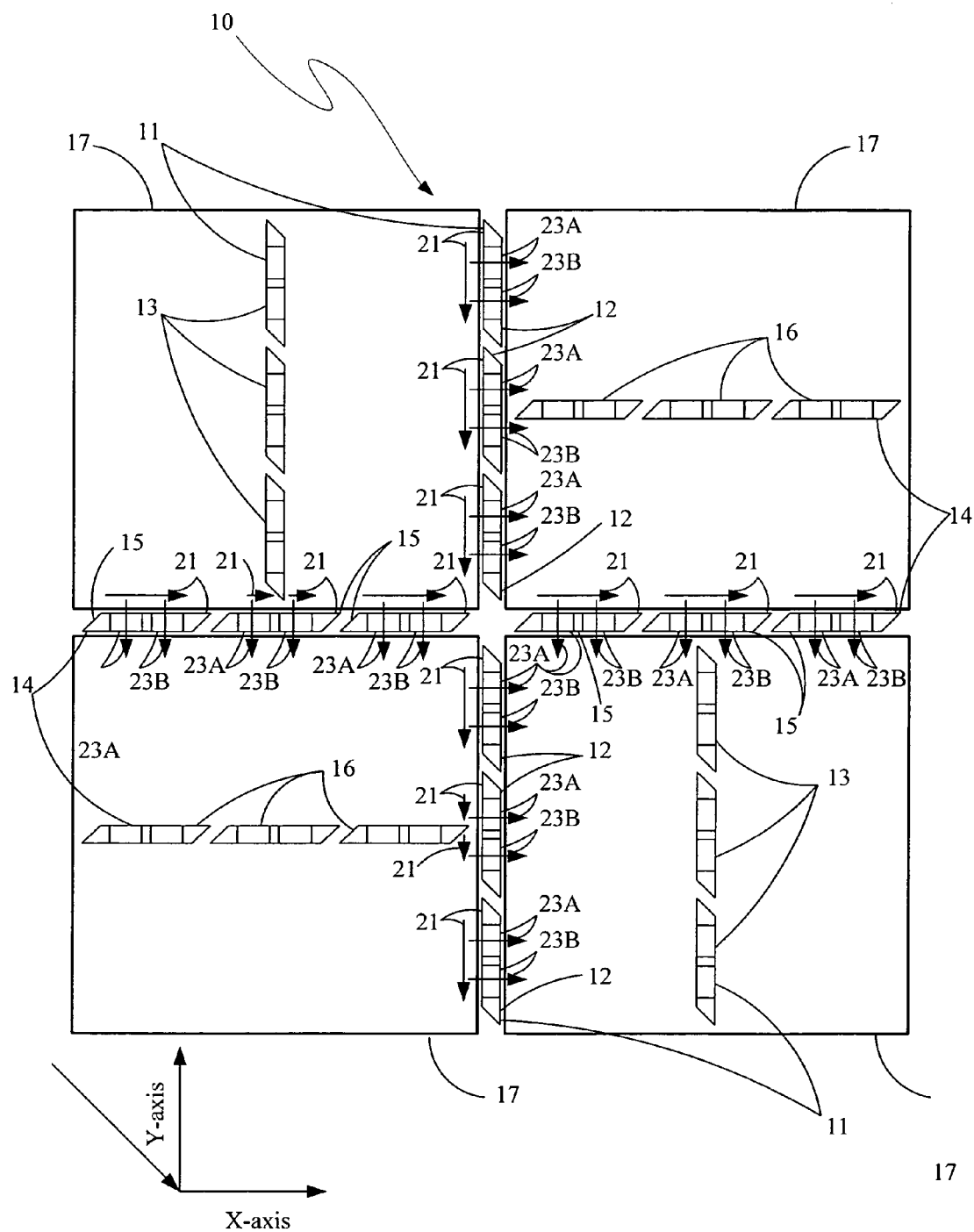
FIG. 9 is a top view schematic of the present invention showing the final magnetization directions for all of the sensor free layers and sensor pinned layers for the sensors after the final annealing.

A top view representation of a resulting composite sensor is shown in FIG. 9 with several magnetoresistors shown in a line for each of sensors 12, 13, 15 and 16 though with the interconnections used to connect those magnetoresistors in a line in series with one another to form such a sensor, and with the interconnections for connecting the sensors in bridge circuits, not being shown. After the wafer has cooled following final annealing and the externally applied magnetic field is removed, the magnetization directions of composite free layers 21 are free to rotate back to being oriented along the length of the magnetoresistors in sensors 12, 13, 15 and 16 as the preferred shape anisotropy induced magnetization directions of the ferromagnetic material in those layers because of the shape anisotropy based biasing effects prevailing. These free layers in the corresponding one of the magnetoreasistors, and the associated arrow next to each representing the magnetization thereof along its layer easy axis, are both designated 21 and shown in FIG. 9.

The directions in which the magnetizations of ferromagnetic material layers 23' are pinned in reference layer structures 23 are retained in orientations resulting from the final annealing which are perpendicular to the lengths of the magnetoresistors, i.e. along the widths thereof. These orientations came about by having completed the cooling of the magnetoresistors after the final annealing so that the CrMnPt antiferromagnetic pinning layer 23" in reference layer structures 23 cooled while the magnetization of CoFe ferromagnetic pinned layer 23' was kept oriented along the width thereof by the components of the externally applied magnetic field directed across the gaps as provided by shield-concentrators 17. Hence, each of the pair of reference layer structures 23A and 23B in each magnetoresistor, and the associated arrow next to each representing the reference direction thereof set by its layer pinned magnetization direction, are both designated 23A or 23B, as appropriate, and shown in FIG. 9.

Figure 10:
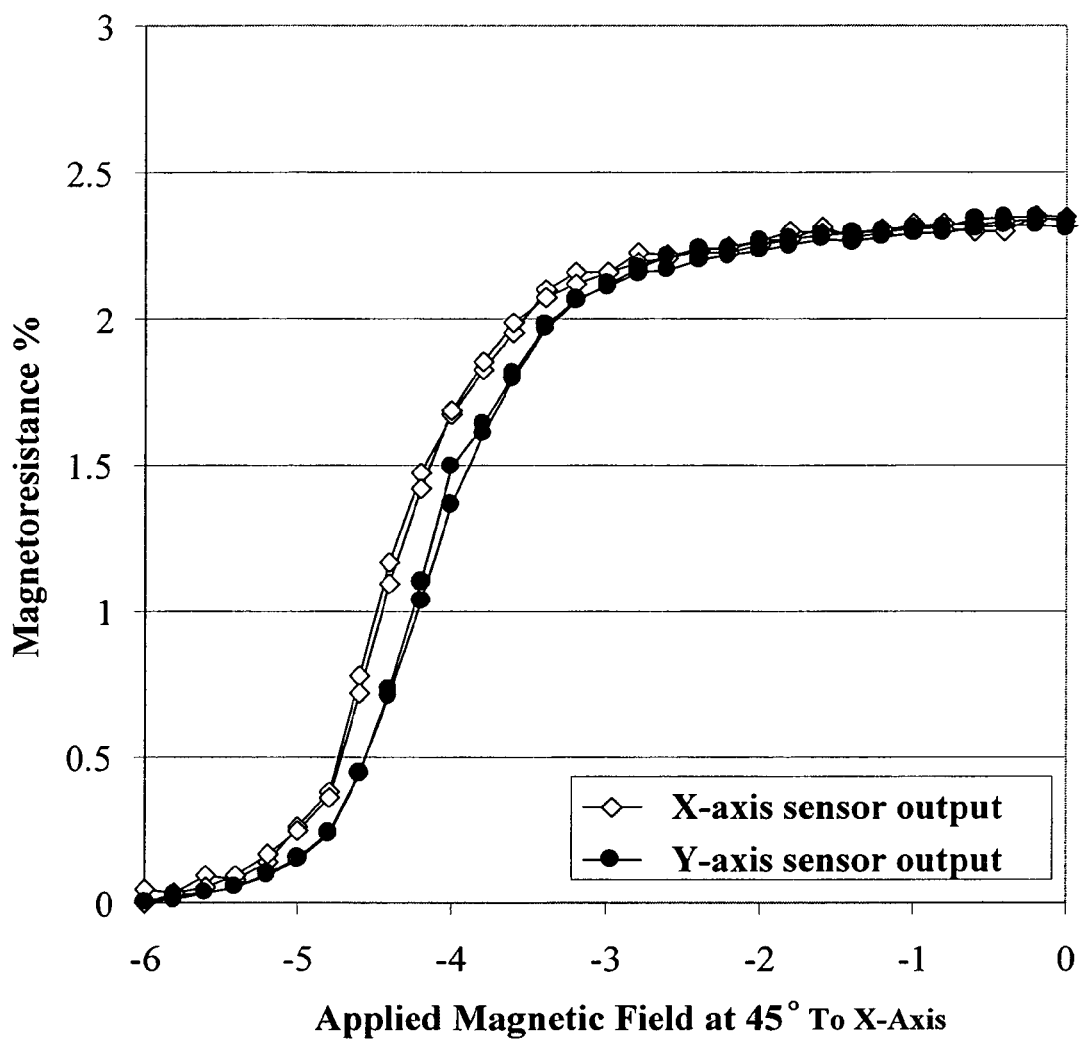
FIG. 10 is a graph showing plots of output voltage from a two-axis sensor of the present invention.

The output response for the sensors 12, 13, 15 and 16 in a bridge circuit for one sensing axis versus externally applied magnetic fields sensed thereby is given in an example showing a characteristic resulting from the present invention as shown in FIG. 10. Since the externally applied magnetic field was directed at 45° to the X-axis to thereby provide approximately equal field components along the X- and Y-axes, the plot shows that the sensors that are sensitive in orthogonal directions but nevertheless have very similar behavior in the composite sensor.

Although the present invention has been described with reference to preferred embodiments, workers skilled in the art will recognize that changes may be made in form and detail without departing from the spirit and scope of the invention.

The invention claimed is:

1. A ferromagnetic thin-film based magnetic field sensor, said sensor comprising:
   a substrate; and
   a plurality of sensing structures supported on said substrate each comprising:
      a nonmagnetic intermediate layer, said nonmagnetic intermediate layer having two major surfaces on opposite sides thereof;
      a magnetization reference layer on one of said nonmagnetic intermediate layer major surfaces having a relatively fixed magnetization direction; and
      a sensing film of an anisotropic ferromagnetic material on that remaining one of said nonmagnetic intermediate layer major surfaces having a length in a selected length direction and a width smaller in extent substantially perpendicular thereto but substantially parallel to said relatively fixed magnetization direction; and
   a first sensitive direction sensing structure and a second sensitive direction sensing structure in said plurality of sensing structures each having said relatively fixed magnetization direction of said magnetization reference layer therein oriented in substantially parallel to said substrate but substantially perpendicular to one another.

2. The apparatus of claim 1 wherein at least one of said first and second sensitive direction sensing structures further comprises a spacer layer on said sensing film and across said sensing film from one of said nonmagnetic intermediate layer major surfaces, said spacer layer having a major surface on a side thereof opposite said sensing film; and an augmenting film of an anisotropic ferromagnetic material on said spacer layer major surface with said spacer layer being sufficiently thick so as to significantly reduce or eliminate topological coupling between said sensing and said augmenting film and to significantly randomize spin states of emerging electrons traversing therethrough.

3. The apparatus of claim 1 wherein said magnetization reference layer in at least one of said first and second sensitive direction sensing structures comprises an anisotropic ferromagnetic material.

4. The apparatus of claim 1 wherein said magnetization reference layer in at least one of said first and second sensitive direction sensing structures is a first magnetization reference layer, and further comprises a second magnetization reference layer provided on that same one of said nonmagnetic intermediate layer major surfaces as said first magnetization reference layer, and also having a relatively fixed magnetization direction.

5. The apparatus of claim 1 wherein said sensing film in at least one of said first and second sensitive direction sensing structures has a shaped end portion extending over a portion of said length in which said width gradually reduces to zero at that end thereof.

6. The apparatus of claim 1 wherein a said nonmagnetic intermediate layer in at least one of said first and second sensitive direction sensing structures is an electrically insulative layer.

7. The apparatus of claim 1 wherein a said substrate comprises a monolithic integrated circuit.

8. The apparatus of claim 1 further comprising a first sensitive direction supplemental sensing structure in said plurality of sensing structures having said relatively fixed magnetization direction of said magnetization reference layer therein oriented in substantially parallel to said substrate and substantially parallel to said that of said first sensitive direction sensing structure.

9. The apparatus of claim 1 further comprising a first magnetically permeable mass having said first sensitive direction sensing structure positioned adjacent to one side thereof and having said second sensitive direction sensing structure positioned adjacent to another side thereof.

10. The apparatus of claim 2 wherein said sensing film and said augmenting film together have a length along a selected direction and a width substantially perpendicular thereto that is smaller in extent than said length, and together have a shaped end portion extending over a portion of said length in which said width gradually reduces to zero at that end thereof.

11. The apparatus of claim 3 wherein said magnetization reference layer is a composite layer and, in addition to a ferromagnetic material layer therein, further comprises an antiferromagnetic material layer therein.

12. The apparatus of claim 8 wherein said first sensitive direction sensing structure and said first sensitive direction supplemental sensing structure are each electrically connected in a common bridge circuit.

13. The apparatus of claim 9 further comprising a shielded sensing structure in said plurality of sensing structures positioned between said first magnetically permeable mass and said substrate.

14. The apparatus of claim 13 wherein said first sensitive direction sensing structure, said first sensitive direction supplemental sensing structure and said shielded sensing structure are each electrically connected in a common bridge circuit.

15. A method for fabricating a ferromagnetic thin-film based magnetic field sensor comprising a substrate supporting first and second sensitive direction sensing structures, said method comprising:
   forming said first and second sensitive direction sensing structures supported on said substrate each comprising a nonmagnetic intermediate layer having two major surfaces on opposite sides thereof with a magnetization reference layer on one of said nonmagnetic intermediate layer major surfaces which is orientable to a relatively fixed magnetization direction and a sensing film of an anisotropic ferromagnetic material on that remaining one of said nonmagnetic intermediate layer major surfaces having a length in a selected length direction and a width substantially perpendicular thereto such that said length direction of said first sensitive direction sensing structure is perpendicular to said length direction of said second sensitive direction sensing structure; and
   annealing said sensor at an elevated temperature while applying an external magnetic field substantially parallel to said substrate at an angle halfway between said sensing film length directions of said first and second sensitive direction sensing structures.

* * * * *

UNITED STATES PATENT AND TRADEMARK OFFICE
CERTIFICATE OF CORRECTION

PATENT NO.        : 7,054,114 B2
APPLICATION NO.   : 10/715144
DATED             : May 30, 2006
INVENTOR(S)       : Albrecht Jander et al.

Page 1 of 1

It is certified that error appears in the above-identified patent and that said Letters Patent is hereby corrected as shown below:

Column 2 of Title Page (56), Line 3, delete "Ooshashi", insert --Oohashi--
Column 6, Line 25, delete "modem", insert --modern--

Signed and Sealed this

Twenty-sixth Day of December, 2006

JON W. DUDAS
*Director of the United States Patent and Trademark Office*